United States Patent [19]

Motegi et al.

[11] Patent Number: 5,241,506

[45] Date of Patent: Aug. 31, 1993

[54] SEMICONDUCTOR MEMORY CIRCUIT APPARATUS

[75] Inventors: Hiroyuki Motegi, Kawasaki; Hideaki Uchida; Yasunori Kuwashima, both of Yokohama, all of Japan

[73] Assignee: Kabushiki Kaisha Toshiba, Kawasaki, Japan

[21] Appl. No.: 612,459

[22] Filed: Nov. 14, 1990

[30] Foreign Application Priority Data

Nov. 15, 1989 [JP] Japan .................................. 1-294986

[51] Int. Cl.$^5$ .............................................. G11C 7/00
[52] U.S. Cl. .................................... 365/210; 365/203; 365/189.01
[58] Field of Search ........... 365/210, 203, 200, 189.09, 365/194, 206, 189.01

[56] References Cited

U.S. PATENT DOCUMENTS 4,982,364 1/1991 Iwahashi ........................ 365/189.09
5,040,148 8/1991 Nakai et al. ...................... 365/210 X

FOREIGN PATENT DOCUMENTS 0337433 10/1989 European Pat. Off. .
2600808 12/1987 France .

Primary Examiner—Joseph A. Popek
Attorney, Agent, or Firm—Finnegan, Henderson, Farabow, Garrett & Dunner

[57] ABSTRACT

A random access memory (RAM) array has a dummy word line having a similar pattern to the word lines provided for the RAM cells. A transistor having the same channel width and channel length as one of the transistors in the RAM cells has its gate connected to the dummy word line. An inverter is formed of three transistors including the transistor having its gate connected to the dummy word line, with the output of the inverter connected to a capacitor. The capacitance of the capacitor is set close to the capacitance of a bus line of the RAM to adjust the dummy word line and the word lines of the RAM circuits to have the same transfer delay. If the capacitance of the capacitor is made slightly smaller than the bus line capacitance, the potential at the output of the inverter can be changed by this difference. The output of the inverter is detected, and can be used as a drive signal to drive a sense amplifier used to read the RAM cells. Further, the signal traveling through the dummy word line can be used as a precharge signal.

9 Claims, 9 Drawing Sheets

PRIOR ART FIG. 1

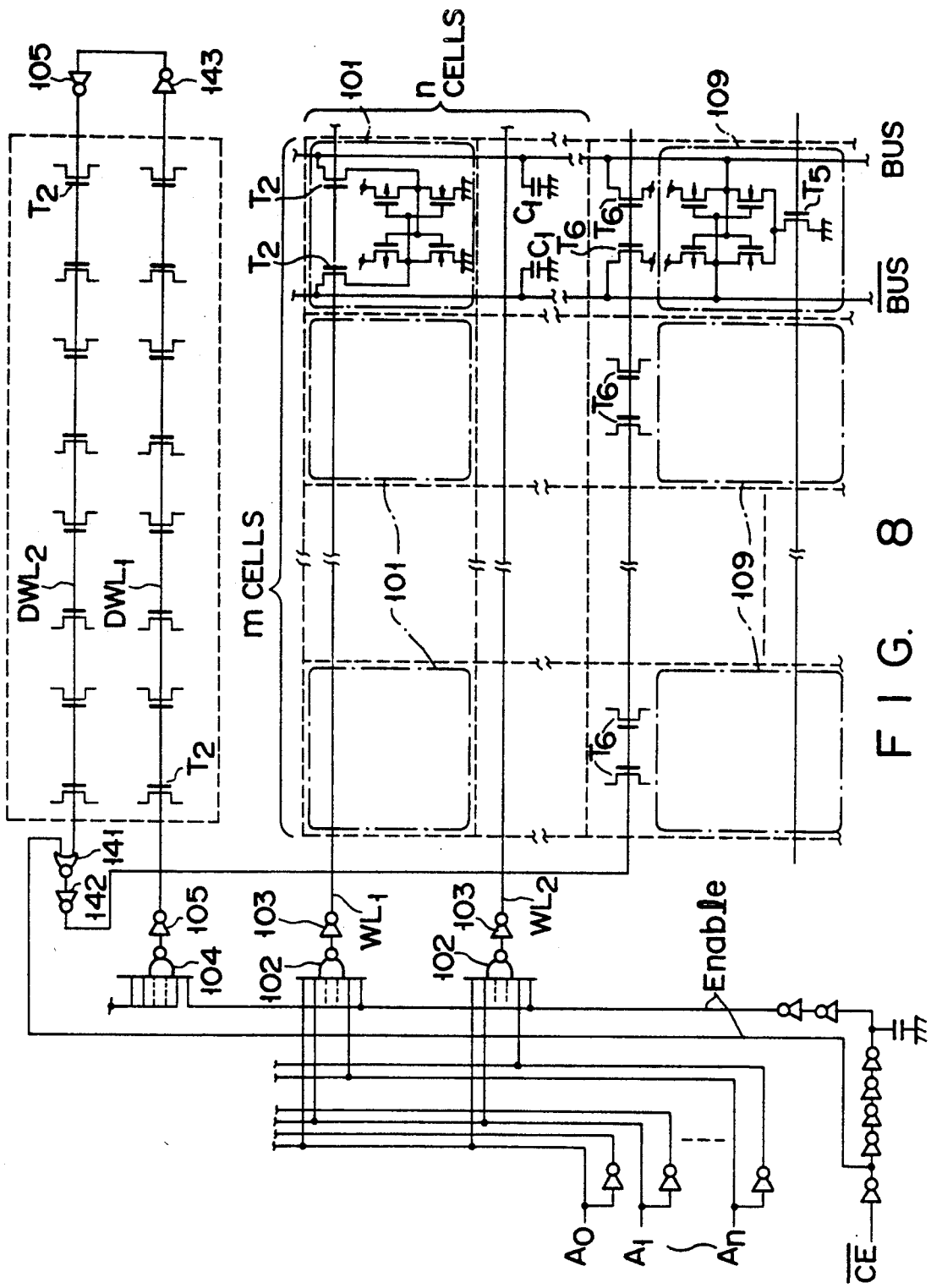
F I G. 8

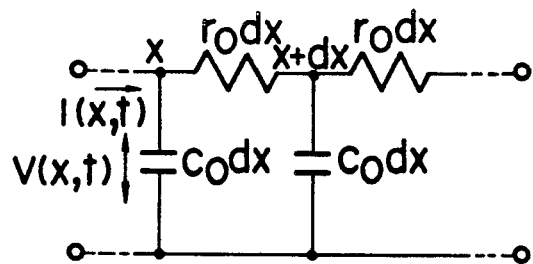
F I G. 11
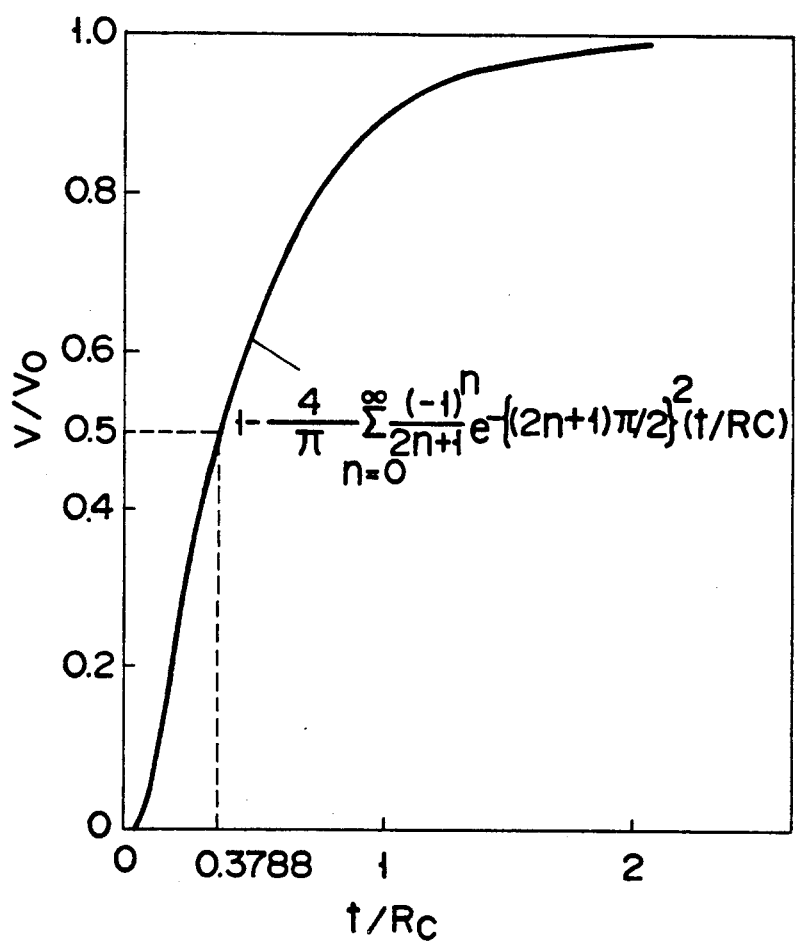
F I G. 12

SEMICONDUCTOR MEMORY CIRCUIT APPARATUS

BACKGROUND OF THE INVENTION

1. Field of the Invention

The present invention relates to a semiconductor memory circuit apparatus, and, more particularly, to a semiconductor memory circuit apparatus having a complementary MOS random access memory (RAM).

2. Description of the Related Art

FIG. 1 illustrates a conventional memory (RAM) circuit portion of this type, and FIG. 2 a timing chart of individual signals in a case where this memory circuit is incorporated in a microcomputer-installed semiconductor memory circuit apparatus, a reference clock for operating the microcomputer, etc., is used, and the read operation for the RAM circuit portion is controlled by the microcomputer.

FIG. 4 illustrates that the individual signals for operating the RAM are prepared from a chip enable signal $\overline{CE}$ by means of an inverter circuit delay and capacitors, shown in FIG. 3, in order to quicken the read operation.

Referring to FIGS. 1 and 2, a description will be given below of the read operation at the time the RAM circuit portion is activated using a reference clock $\phi$. To begin with, "$A_O$ to $A_n$" in FIG. 1 denote address signals, and RAM cells 101 are arranged in a m×n matrix. A circuit 109 is a sense amplifier circuit for fixing the potential level quickly to a low ("L") level when data starts moving from a selected one of the RAM cells to one of a pair of bus lines BUS and $\overline{BUS}$, e.g., to the one having an "L" level. This circuit 109, which is operational by a sense signal SENSE, reads data by clocked inverter 111, and outputs data Data (A). A circuit 110 serves to write data in the RAM cells 101, and receives a control signal Write and write data Data (B). A transistor $T_6$ serves to precharge the bus lines BUS and $\overline{BUS}$, and is controlled by a control signal $\overline{Pre}$. An enable signal Enable serves to prevent word lines $WL_l$ to $WL_n$ in a non-selected state from being selected while the addresses $A_O$ to $A_n$ are being changed; the signal Enable is often prepared from a chip enable signal ($\overline{CE}$).

Assuming that, in FIG. 2, the address ADDRESS is changed and settled at the rising of the reference clock $\phi$ and the precharge signal $\overline{Pre}$ changes to a "H" (high) level from "L", the bus lines BUS and $\overline{BUS}$ in FIG. 1 maintain the "H" level.

When the enable signal Enable changes to "H" from "L", one of N NAND circuits 102 is selected to output a select signal of level "H" from an inverter 103 to one of the word lines $WL_l$ to $WL_n$. This "H"-level signal is transferred to the end of the word line through a polysilicon wire constituting that word line. When the potential level of the word line WL (one of $WL_l$ to $WL_n$) exceeds the threshold voltage of a transistor $T_2$, as shown in FIG. 9, the charge accumulated in a load capacitor $C_1$ connected to the bus line BUS is discharged through the transistor $T_2$ having its gate electrode as a word line, from that one of the nodes of two inverters in the RAM cell which is outputting an "L"-level signal, 120 in the diagram. As a result, as shown in FIG. 1, the bus line $\overline{BUS}$ side keeps the "H" level while the level of the bus line BUS side starts moving toward "L." When the potentials of both bus lines become different from each other, the sense amplifier 109 performs the sensing operation, and the $\overline{BUS}$ side is supplied with an "H" level signal by the amplifier 109 while the BUS side sharply changes its level to "L," becoming stable at the ground level. The signal on the bus line BUS can, therefore, be taken as data Data (A) in response to a read signal $\phi$ read.

As described above referring to FIG. 2, the use of the reference clock $\phi$ can sequentially enable the individual signals, which operate the RAM circuit portion, and is significantly effective. Since the operation depends on the clock, however, this system is very unstable in high-speed operation.

FIG. 3 illustrates a circuit in which in order to improve the operational speed of the RAM circuit portion in FIG. 1, the individual signals necessary for the read operation of the RAM circuit are prepared by delaying a chip enable signal ($\overline{CE}$) or a chip select signal ($\overline{CS}$), which enables the memory operation, through an inverter 241, a NOR circuit 242 and a capacitor C.

Since the individual RAM control signals are determined by the time needed for charging/discharging the capacitor C, this circuit ensures a quicker operation than the one shown in FIG. 2.

It can therefore be said that the circuit in FIG. 2 which uses the reference clock $\phi$ is suitable for low-speed and middle-speed operations, whereas the one shown in FIG. 3 is suitable for a high-speed operation. According to the circuit in FIG. 3, however, when the source voltage of the semiconductor circuit apparatus changes, the ON resistance of transistors constituting the inverter 241 changes, varying the time needed for charging/discharging the capacitor C. The times from the falling of the chip enable signal ($\overline{CE}$) to the points at which the individual signals $\overline{Pre}$, Enable, SENSE and $\phi$ read are prepared, would considerably vary depending on the source voltage in use. In some cases, therefore, when the word line $WL_l$ is selected, for example, the sense amplifier 109 performs the sense operation before the "H" level signal for rendering the transistor $T_2$ on reaches the end of that word line, and if there is no potential difference between BUS and $\overline{BUS}$, the BUS side, which should be set at the "L" level, becomes "H" and the $\overline{BUS}$ side, which should have the "H" level, becomes "L" due to the influence of the operational noise or a like cause. In addition, even if a signal of the level to turn on the transistor $T_2$ reaches the end of the word line thereafter, the output buffer performance of the sense amplifier is normally greater, and the levels of the BUS and $\overline{BUS}$ are not easily changed. It may sometimes happen that data in the RAM cells 101 will vary due to the action of transistor $T_2$.

As the number of the RAM cells in the horizontal direction (m) increases, as in the equivalent circuit in FIG. 10B of the portion shown in FIG. 10A, the resistance R' of the polysilicon wire constituting a word line, and the transfer gate capacitance $C_G$, floating capacitance, etc. of each RAM cell become too large. As a result, the time constant $\tau = CR$ of the word line WL becomes a dominant factor for the signal delay time at the vicinity of the end of that word line. Therefore, reducing the ON resistance of the transistors of a word-line driving output inverter 105 (corresponding to 103 in FIG. 1) does not quicken the signal delay time. The apparatus in FIG. 3 having a voltage-dependent circuit and large-capacity RAM cells would cause a time difference between the signal delay of the word line and the timing of the control signals shown in FIG. 4, or restrict the source voltage in use.

FIG. 5 illustrates a conventional circuit in which an NOR circuit 130 and an inverter 131 are provided in light of the signal delay of the word line, and the sense amplifier 109 is operated accordingly. This circuit has many wires up to the NOR circuit 130 in order to detect a selected one of the n word lines, requiring a comparative size of an area for the wiring region and the NOR circuit 130, etc., in the semiconductor circuit apparatus.

If the signal delay on the word line is determined by the time constant CR or the like, when the read operation or write operation is completed, the time indicated by $T_{12}$ in FIG. 4 becomes too short to set the end of the word line to "L" from "H" in a case where the circuit, like the one shown in FIG. 3, is voltage-dependent. As a result, the precharge transistor $T_6$ is turned on while the transfer gate $T_2$ in the RAM cell 101 in FIG. 1 is not completely turned off, generating a current path from the $V_{DD}$ voltage supply to BUS, transistor $T_2$, transistor $T_1$ and to ground. This phenomenon should not necessarily occur in one RAM cell; a comparative number of paths would occur at the vicinity of the end of the word line, thus increasing the through current between voltage supplies as well as current consumption.

As described above, the conventional semiconductor memory circuit apparatuses have the following shortcomings:

(1) With the use of a reference clock $\phi$ (FIG. 2) used in a microcomputer, the RAM operation is controlled by the clock, limiting high-speed operation. This system is therefore not suitable for high-speed operation. In addition, some systems may not use a clock as the base for various control signals.

(2) If control signals are prepared by delaying the chip enable signal $\overline{CE}$, chip select signal, etc., using the inverter delay and drain capacitance or the like in order to ensure high-speed operation of the RAM circuit portion, a change in source voltage varies the ON resistance of the transistors constituting an inverter, altering the signal delay. As a result, the sense timing changes, etc., which causes the normal operation range of the RAM circuit portion to appear as source-voltage dependency. This may restrict the range of the source voltage in use.

(3) As the memory capacity of RAM increases and the word line becomes longer, the delay of signals traveling on the word line is determined by the time constant $\tau = CR$ which is determined by the resistance R of the word line and the gate capacitance C hanging therefrom. Therefore, the resultant, delayed signals are unlikely to have a certain relativity to the voltage-dependent control signals prepared in the above case (2).

(4) A variation caused by the fabrication of semiconductor memory apparatuses, i.e., a variation in time constant $\tau$ (such as a variation in resistance R of the polysilicon wire constituting the word line, a variation in gate capacity C hanging from the word line, etc.) is not proportional to the fabrication-oriented variation in the circuit shown in FIG. 3 (such as a variation in the junction capacity), the normal operation range may be restricted as in the case of (3). This causes a yield reduction as said to occur in producing semiconductor memory circuit apparatuses.

(5) The employment of the NOR logic of each word line as shown in FIG. 5, inevitably increases the wiring area and the area of the logic circuit necessary for preparing the NOR circuit 130.

(6) At the time the NOR circuit is placed in an unselected status after completion of the read/write operation, when the time constant of the word line is large and the precharge signal of the circuit in FIG. 5 becomes an enable status quickly, the transfer gate $T_2$ at the vicinity of the end of the word line for reading data from the RAM cell would not be completely turned off, generating the through current.

SUMMARY OF THE INVENTION

It is therefore an object of the present invention to overcome the above problems (1) to (6) and thus provide a semiconductor memory circuit apparatus which uses a dummy word line in order to obtain the desired delay time from an enable signal, whereby it does not depend on the source voltage, can cope with a process-oriented variation and can ensure a stable and sure operation according to the time constant of a word line.

To achieve this object, according to the present invention, in a RAM having RAM cells arranged in a matrix of a plurality of rows and a plurality of columns, a dummy word line having the same pattern and the same gate as the word lines in the RAM cells is provided at any point up to the end of the word lines to detect a word line being selected and operate a sense amplifier hereafter, a transistor (second transistor) having the same W/L (W: channel width; L: channel length) as the output transistor in the RAM cell is connected in series between a transistor (first transistor) similar to the RAM cell transfer gate at the last stage and the ground voltage, for example, with an enable signal used as the gate input of the second transistor. Between the first transistor and a voltage supply $V_{DD}$, a transistor (third transistor) of a different polarity from that of the second transistor is provided, and the enable signal is used as its gate input, whereby the second and third transistors constitute an inverter. Making the capacity of the drain portion of this inverter close to the bus line capacitance on the RAM side adjusts the dummy word line and the word line on the RAM circuit side to have a similar signal propagation delay. Therefore, slight adjustment of the drain capacitance on the dummy side corresponding to the bus line can quickly alter the drain potential accordingly, so that the drain potential detected can be used as a drive signal for the sense amplifier.

Further, one, two or three dummy word lines, or one or two plus an intermediate length ($\alpha$) shorter than the full length are provided in order to apply precharging after the word lines are changed to an unselected status from a selected status. Even if, for example, the wiring resistance of the dummy word lines increases and the rising or falling time of the word line drive circuit is determined by the time constant of the word lines, a precharge signal is prepared through the delay of the time constant caused by keeping the time constant of the dummy word lines at the length of the total number of the word lines on the RAM side or this total number plus $\alpha$ (one + $\alpha$ or two + $\alpha$) until the transfer gate at the end of the word line is turned off.

As the dummy word line having the same shape and the same pattern as the word lines in the RAM circuit are provided and the drain capacitance of that dummy-side transistor corresponding to the bus lines in the RAM circuit is set close to the load capacity of each word line (e.g., slightly smaller than the load capacitance), it is possible to quickly detect that the signal on the word line has reached the end thereof and operate the sense amplifier, thus preventing the sense amplifier from erroneously functioning at the wrong timing and ensuring high-speed data reading.

Further, the time for the word line on the RAM circuit side to change to unselected status (the transfer gate at the end of the word line rendered off) from the selected status after completion of the read/write operation is secured by the full number (length) of dummy word lines or greater until the precharging starts. This can prevent generation of a through current which flows from the precharge transistor in the RAM cells via the transfer gate.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 8 is a circuit diagram of another embodiment of the present invention;

FIG. 11 is a diagram illustrating a wire distribution constant model; and

FIG. 12 is a transient characteristic diagram of a circuit with a distribution constant RC.

DETAILED DESCRIPTION OF THE PREFERRED EMBODIMENTS

Figure 1:
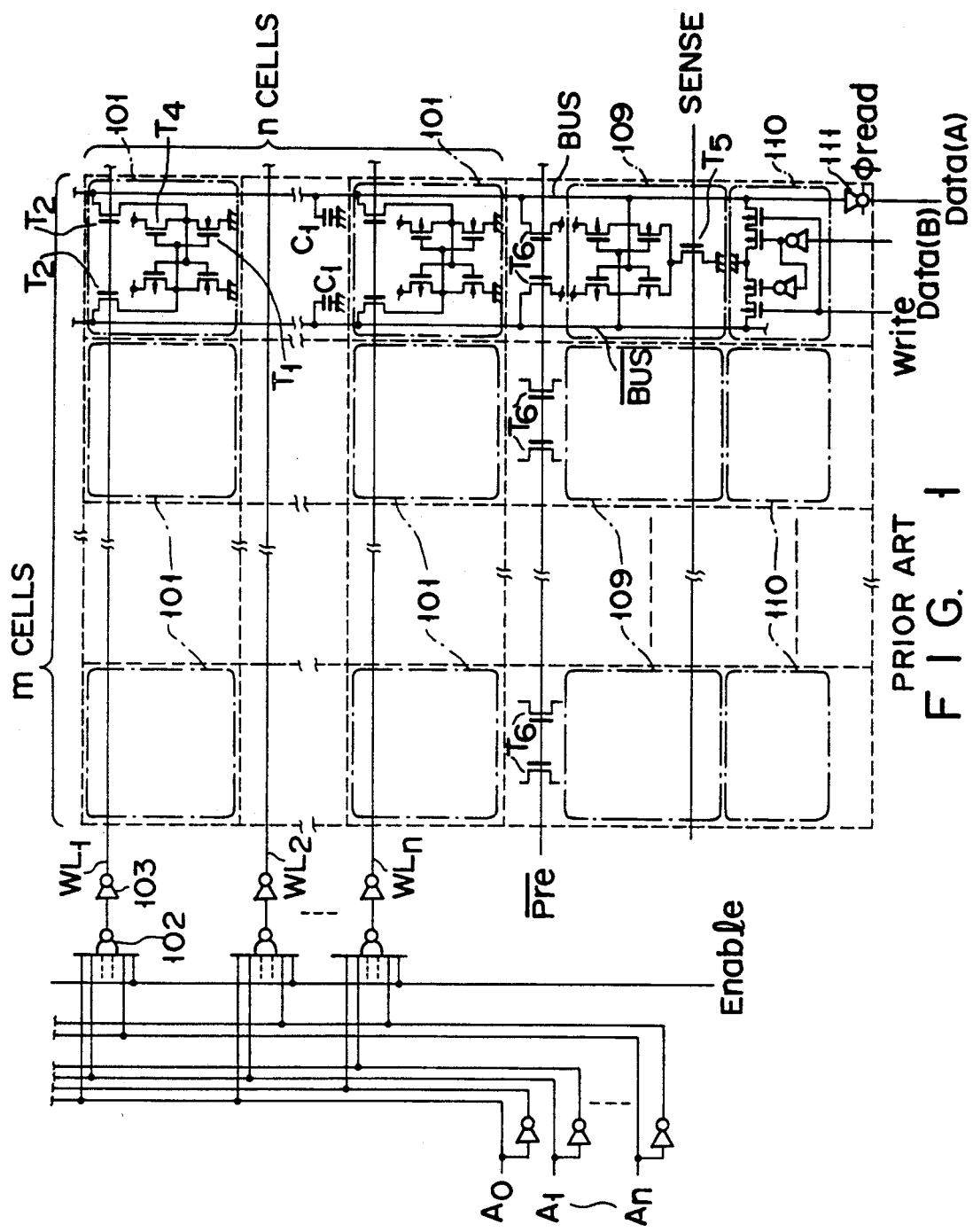
FIG. 1 is a diagram illustrating a conventional RAM circuit.
Figure 2:
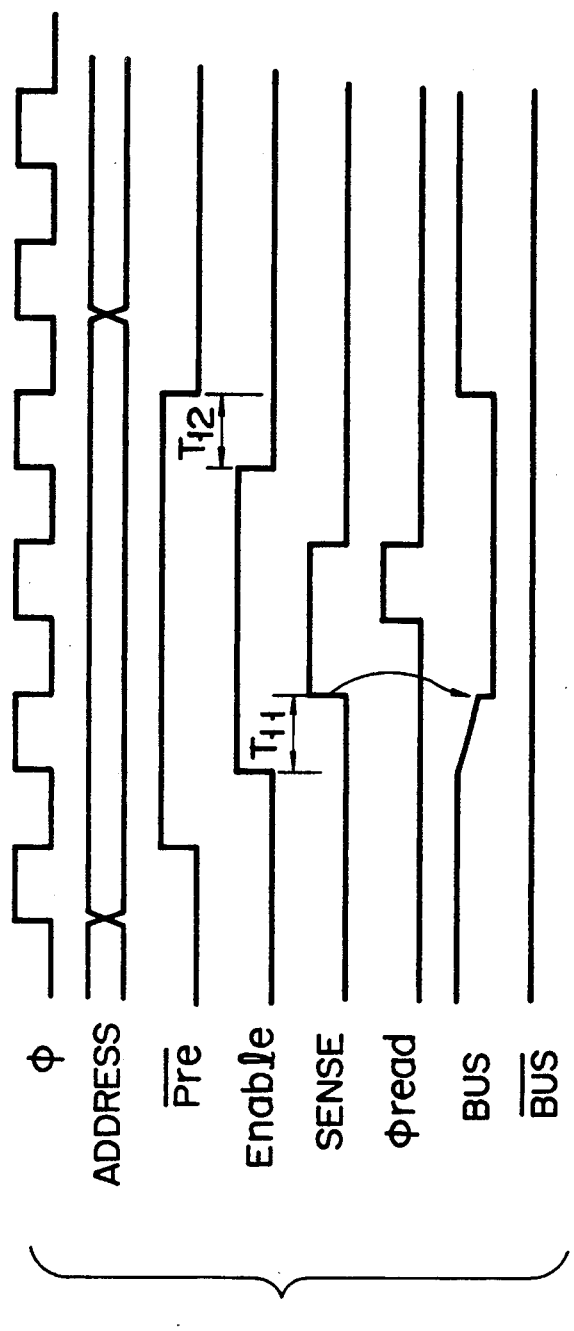
FIG. 2 is a timing chart given when the circuit shown in FIG. 1 is operated in synchronism with a clock.

One preferred embodiment of the present invention will now be described referring to the accompanying drawings. As FIG. 7 presents a circuit diagram of this embodiment in association with the one shown in FIG. 1, the same reference numerals are given to corresponding or identical portions.

Figure 7:
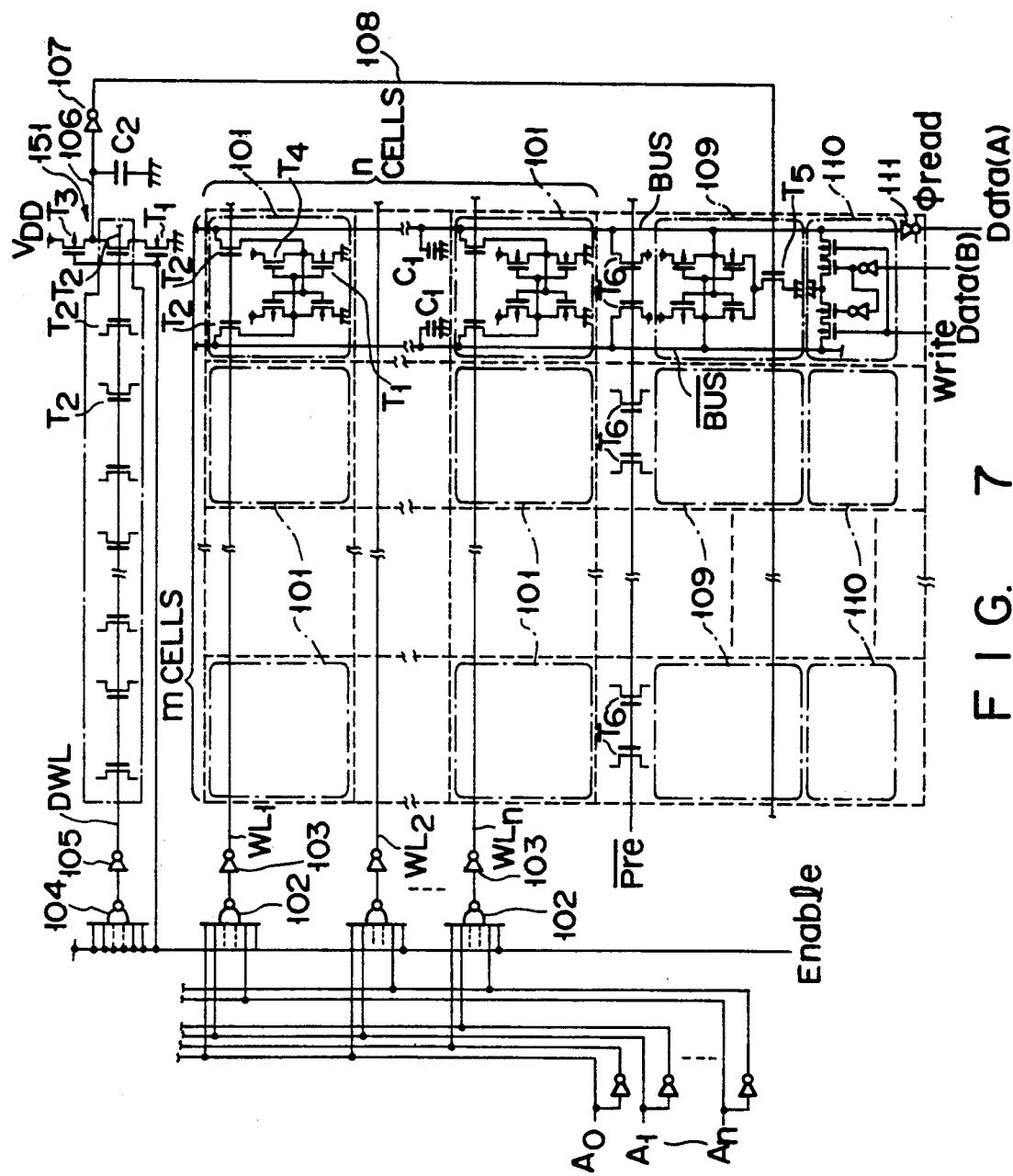
FIG. 7 is a circuit diagram of one embodiment of the present invention.

Referring to FIG. 7, $A_O$ to $A_n$ are address signals for selecting a word line (any of $WL_l$ to $WL_n$) of the RAM cells 101 arranged in an m×n matrix. A NAND gate 102 decodes these address signals and an enable signal Enable to render the memory portion operable. Reference numeral 103 denotes an inverter serving as a buffer. This RAM circuit has the same gate inputs as the NAND circuit 102, and comprises an NAND circuit 104 whose output is determined by the signal Enable, an inverter 105 having the same transistor performance as the inverter 103, and a dummy word line DWL having the same shape as the word lines $WL_l$-$WL_n$ and the same type of transistor $T_2$ as a cell transfer gate ($T_2$). A transistor $T_1$, which has the same W/L as the transistor $T_1$ in the RAM cells 101 and receives the signal Enable as the gate input, is connected in series between his transistor $T_2$ and ground. A transistor $T_3$ having a different polarity from the transistor $T_1$ and the same size as a transistor $T_4$, is provided on the other side of the transistor $T_2$ and is also supplied with the Enable signal as the gate input. These transistors $T_1$ to $T_3$ constitute an inverter 151, which has its drain 106 connected to a capacitor $C_2$ having a capacitance 1/a times greater, or equal to or a times greater than that of a floating capacitor $C_1$ that may be formed on a bus line of the memory cell by a junction capacitor or the like (a: nearly equal to 1). The RAM circuit further comprises an inverter 107 for detecting the potential difference of the drain 106 and for operating a sense amplifier 109, a transistor $T_6$ for precharging bus lines Bus and $\overline{BUS}$ of the RAM, a write circuit 110 for writing data into the RAM cells, and a clocked inverter 111 for reading out data from the bus lines.

Figure 9:
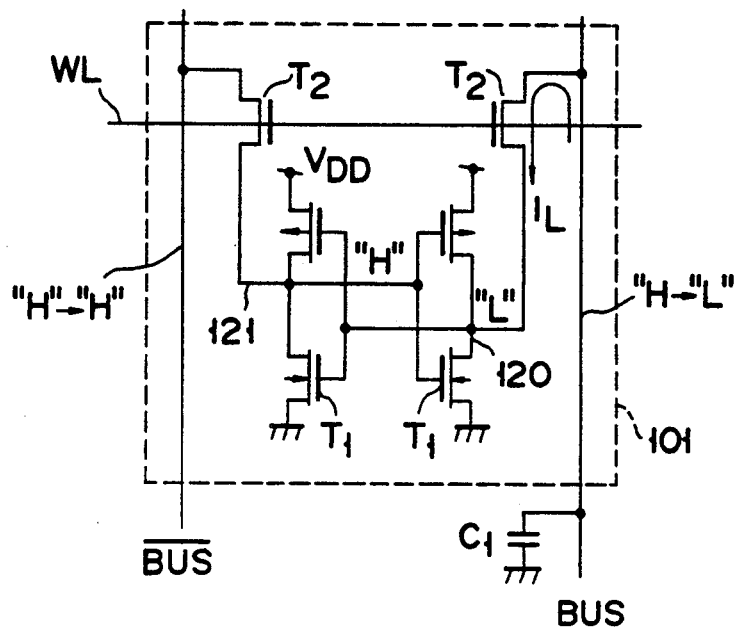
FIG. 9 is a circuit exemplifying a RAM cell circuit.

In the circuit shown in FIG. 7, when the address signals $A_O$-$A_n$ are specified, the enable signal Enable becomes an "H" level, starting the read operation, and one of the word lines $WL_l$-$WL_n$ is selected by the value of the address signals $A_O$-$A_n$ to start transferring the "H" level of the word select signal in the X direction of the RAM cells. Provided that the data has been held with the node 120 of the RAM cell 101 at the end of the selected word line, as shown in FIG. 9, in an "L" (ground level) state and the node 121 in an "H" ($V_{DD}$ level) state, the selected word line turns on the transistor $T_2$ to, thereby, render bus line BUS of the bus line pair BUS and $\overline{BUS}$ which have been precharged to the $V_{DD}$ level ("H" level) before data reading, thus starting the discharge from "H" to "L" through the transistor $T_2$.

If the sense amplifier 109 (FIG. 7) having BUS and $\overline{BUS}$ as its inputs, executes the sense operation when there is a potential difference between BUS and $\overline{BUS}$, the potential of the BUS side is dropped to the ground level, the sure "L" level. Assume that the dummy word line DWL having the same pattern, the same gate capacitance and the same resistance as the word lines $WL_l$-$WL_n$ is provided, the transistor $T_2$ at the very end of the dummy word line is given the same W/L as the transistor $T_1$ in the RAM cells, another transistor $T_1$ supplied with the enable signal Enable as the gate input is connected in series between the transistor $T_2$ and the ground, and the transistor $T_3$ having a different polarity from the transistor $T_1$ is provided on the other side of the transistor $T_2$ and is also supplied with the Enable signal as the gate input, thus constituting the inverter 151, which has its drain 106 connected to the capacitor $C_2$ having a capacitance of half the capacitance of the floating capacitor $C_1$ formed on the bus line BUS of the memory cells by a junction capacitor or the like. The falling time $t_f$ ("H" to "L") of the NAND circuits 102 and 104 and the rising time $t_r$ ("L" to "H") of the inverters 103 and 105 both from the point of time when Enable becomes "H" from "L" become equal to each other. The provision of the dummy word line DWL having the same shape, the same length and the same transistor $T_2$ as the word lines ($WL_l$-$WL_n$) on the RAM circuit side provides the equal transfer delay for signals traveling from the inverters 103 and 105, so that the gate potential of the transistor $T_2$ in the RAM cell 101 at the end of the word line and that of the transistor $T_2$ at the end of the dummy word line DWL change in quite the same manner from the point of time when the signal Enable becomes active. The current flowing through the transistors $T_1$ and $T_2$ in the RAM cell and the current flowing through the transistors $T_1$ and $T_2$ at the end of the dummy word line DWL discharge the same amount of charge in the region of a MOS transistor, called "saturation area of $V_{GS}-V_{TH} \leq V_{DS}$". Provided that the load capacitance $C_2$ is half the capacitance of the load capacitor connected to the bus line BUS, a change in potential of the bus line BUS discharged through the transistors $T_1$ and $T_2$ in the RAM cell is $\Delta V_1$, whereas the potential change becomes $2 \times \Delta V_1$ on the dummy word line side whose load capacity is ½. It should be noted that this potential change, $2 \times \Delta V_1$, would not show the proportional relation when the node 106 enters the non-saturation area of $V_{GS}-V_{TH}>V_{DS}$ from which the drain-voltage dependency starts, from the saturation area. However, the potential change at the node 106 on the dummy side is still greater than the potential change of the bus line BUS. Quickly detecting the potential at the node 106 means that the output signal of the transistor 103 has reached the end of the word line on the RAM circuit side, the transfer gate $T_2$ is turned on, and the charge on the bus line BUS is discharged, causing a potential difference between BUS and $\overline{BUS}$. The potential level of the node 106 when detected can be used as a timing signal for permitting the sense amplifier to perform the sense operation, thus preventing the erroneous function of the sense amplifier at the wrong timing. From the view point of production of semiconductor circuits, even if the resistance of polysilicon constituting the word lines and the gate capacitance of the transistors vary, this variation is the same for both word lines WL on the RAM circuit side and the dummy word line DWL, inhibiting the sense amplifier from operating at the wrong timing, such as earlier start of the sensing operation.

Figure 3:
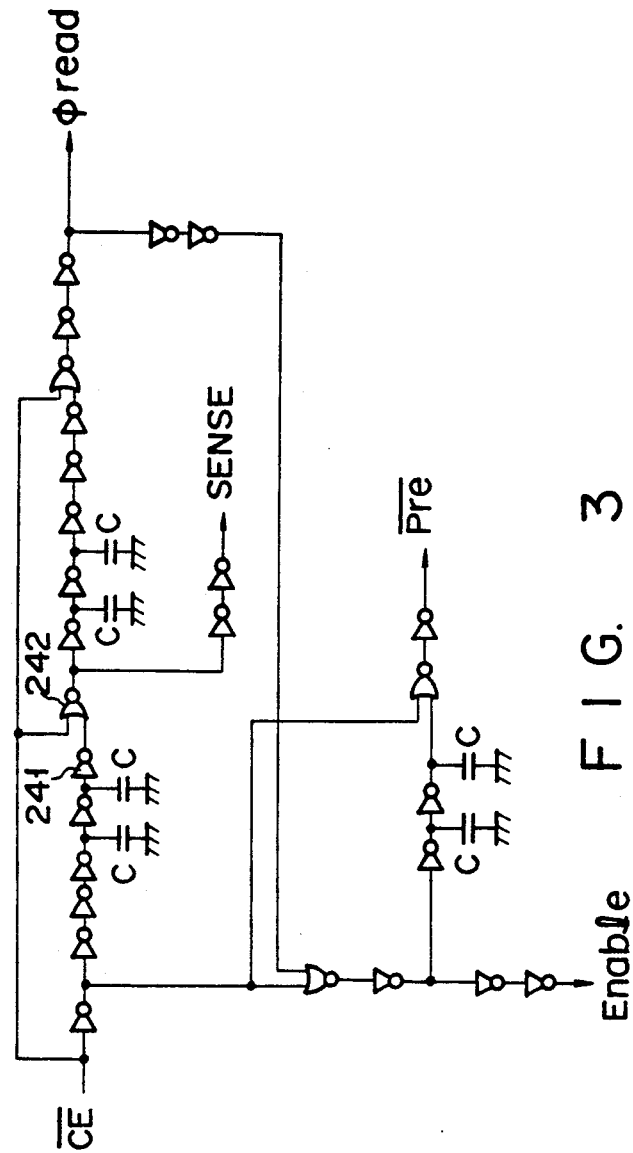
FIG. 3 is a circuit diagram in a case where the circuit in FIG. 1 is operated with the inverter delay and a capacitor.
Figure 4:
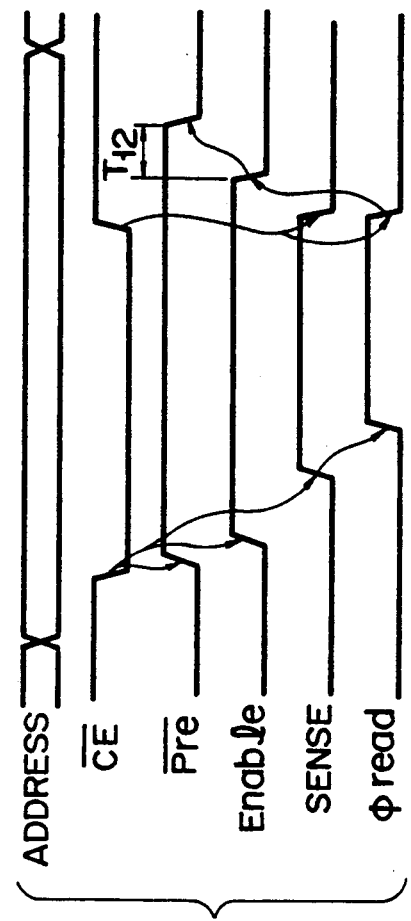
FIG. 4 is a timing chart illustrating the operation of the circuit in FIG. 3.
Figure 5:
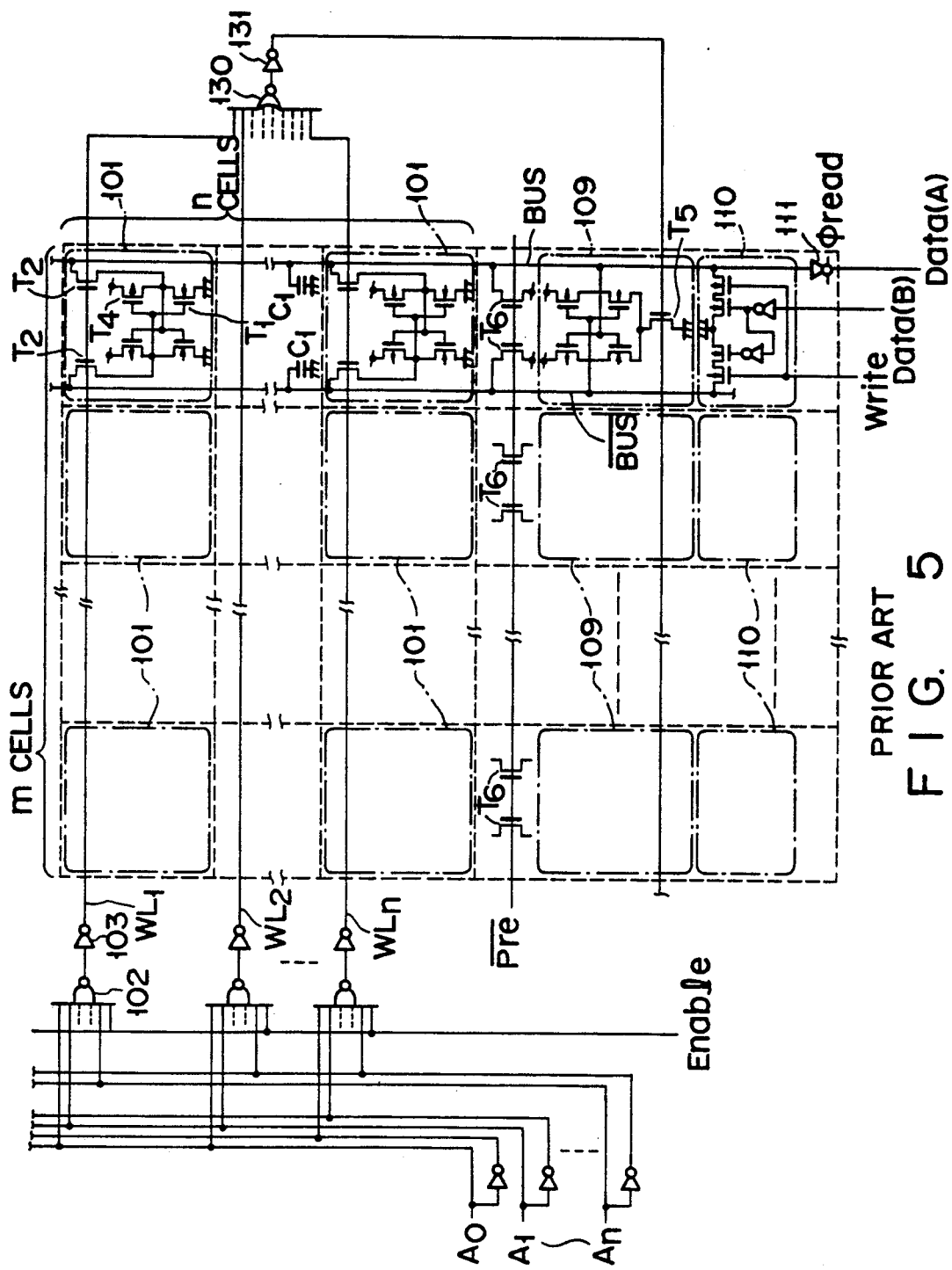
FIG. 5 is a circuit diagram for functioning as a sense amplifier according to another conventional art.

In addition, it is possible to eliminate the voltage dependency according to the source voltage or the like in use, which is apparent in the circuit system as shown in FIG. 3 using the control signals prepared by the inverter and capacitor delay or the like.

FIG. 8 illustrates another embodiment of the present invention. Referring to FIG. 8, $A_0$ to $A_n$ denote address signals and the RAM cells 101 are arranged in an m×n matrix as in FIG. 7. Two dummy word lines having the same pattern and length as the word lines on the RAM circuit side as in FIG. 7 are provided and inverters 143 and 105 are inserted in the dummy word lines.

As the X-directional length of the RAM cells (FIG. 8) or m in the m×n matrix increase, the resistance R of polysilicon constituting each word line and the capacitance of the transfer gate $T_2$ or the wire floating capacitance becomes larger. When the on resistance $R_O$ of the transistors of the output inverter 105 becomes $R_O<R$, the transfer delay of the transistor 105 given to the end of the word line would be determined by the time constant $\tau=CR$ of the word line. Since m RAM cells 101 having the same shape are generally arranged on each word line of RAM, this word line become equivalent to those shown in FIG. 10 which has a wire resistance R' of polysilicon constituting the word line and the gate capacitance $C_G$, the main load capacitance, equally distributed. The signal delay in the equal-distribution model shown in FIG. 12, which is disclosed in, for example, the publication "Super High-speed MOS Device," p 255, issued by Baifukan, supervised by Takuo Sugano and edited by Susumu KOHYAMA, is expressed as follows:

$$\frac{V}{V_O} = 1 - \frac{4}{\pi} \sum_{n=0}^{\infty} \frac{(-1)^n}{2n+1} e^{-\{(2n+1)\pi/2\}^2 t/RC} \quad (1)$$

where $V_O$ is the voltage width on the sender side and V is the response voltage. Since this signal delay takes a significant approximation up to n=2 (n: the number of divided segments of the word line in terms of the distribution constant; therefore, n=2 means that the word line is divided into two), it may also be expressed at very high precision as follows:

$$\frac{V}{V_O} \simeq 1 - \frac{4}{\pi} e^{-(\frac{\pi^2}{4})t/RC} \quad (2)$$

FIG. 11 illustrates the distribution constant model of the wires based on which equations (1) and (2) have been derived, and FIG. 12 illustrates the transient characteristic of the RC (distribution constant) circuit in equation (1).

Suppose that, in FIG. 8, the reading or writing operation has been completed and the enable signal Enable has changed to "L" from "H" to set the circuit to the standby status. Since the transfer delay (from "H" to "L" in this case) of the potential to the end of the word line on the RAM circuit side is the same as that to the gate input of the inverter 143, if threshold voltage $V_{TH}$ of the inverter 143 is designed to be $V/V_O=0.5$ or ½ $V_O$, substituting $V/V_O=0.5$ in equation (2) in view of the characteristic shown in FIG. 12 yields $$\frac{V}{V_O} = 1 - \frac{4}{\pi} e^{-(\frac{\pi^2}{4})t/RC} \quad (3)$$

$$0.5 = 1 - \frac{4}{\pi} e^{-(\frac{\pi^2}{4})t/RC}$$

$$-0.5 = -\frac{4}{\pi} e^{-(\frac{\pi^2}{4})t/RC}$$

$$\frac{0.5\pi}{4} = e^{-(\frac{\pi^2}{4})t/RC}$$

$$\frac{\pi}{8} = e^{-(\frac{\pi^2}{4})t/RC}$$

$$\text{Log}e \frac{\pi}{8} = -\left(\frac{\pi^2}{4}\right)t/RC$$

$$t = \left(\text{Log}e \frac{\pi}{8}\right) RC \left(-\frac{4}{\pi^2}\right)$$

$$= 0.3788 RC$$

$$(t/RC = 0.3788)$$

and this value is shown in FIG. 12.

Provided that with the source voltage $V_{DD}=5$ (V) in the circuit shown in FIG. 8, the threshold voltage $V_{TH}$ of the transfer gate $T_2$ is $V_{TH}=0.9$ (V), the voltage change necessary for the transfer gate at the end of the word line to change its state to OFF from ON is $5-0.9=4.1$ (V). The time may be computed also as follows using equation (2):

$$\frac{4.1}{5} = 1 - \frac{4}{\pi} e^{-(\frac{\pi^2}{4})t/RC} \quad (4)$$

$$\left(\frac{4.1}{5} - 1\right)\left(-\frac{\pi}{4}\right) = e^{-(\frac{\pi^2}{4})t/RC}$$

$$\frac{0.9\pi}{5.4} = e^{-(\frac{\pi^2}{4})t/RC}$$

$$Log_e \frac{0.9\pi}{20} = -\left(\frac{\pi^2}{4}\right)t/RC$$

$$t/RC = 0.79288$$

From the above, in FIG. 8, it requires the time of 0.3788RC from equation (3) for the potential at the end of the dummy word line DWL to be $\frac{1}{2} \cdot V_{DD}$ after the level of the signal Enable becomes "L" from "H" and it also needs the time of 0.3788RC from the point at which the output levels of the inverters 143 and 105 change when this potential has reached $\frac{1}{2} \cdot V_{DD}$ to the point when the level of the second word line changes to "L" from "H" following the first word line. (It should be assumed that the NOR circuit 141 also has the threshold value $V_{TH}$ of $\frac{1}{2} \cdot V_{DD}$.). Then, $$0.3788RC \times 2 = 0.7576RC \quad (5)$$

As compared with equation (4), there is an insufficient delay of $$(0.7929 - 0.7576)RC = 0.0353RC \quad (6)$$

before the precharging starts, or the charging starts earlier by that amount. This insufficient delay can be compensated for by the delay made by the inverters 143, 105 and 142, or the NOR circuit 141, and the wire delay. The gate bias potential applied to the transfer gate T2 with the delay caused by the two word lines as given by equation (5) is very close to the threshold voltage of the transistor T2, and the through current is small. Substituting t/RC=0.7576 in equation (2) yields V/V₀=0.8036 and further substituting $V_{DD}$=5 (V) yields V=4.02 (V). It should be apparent from this that approximately 0.1 (V) is required for the transistor T2 to be turned off.

In addition, dividing equation (4) by equation (3) yields a value of 2.0931, which means that the use of three dummy word lines can make precharging after the transistor T2 at the end of the word line on the RAM circuit side is turned off.

As the source voltage becomes lower, a fewer number of the dummy word lines are required. For instance, provided that $V_{DD}$=3 (V) and the threshold voltage of the transistor T2 is 0.9 (V), substituting these values in the equation (2) yields $$\frac{3 - 0.9}{3} = 1 - \frac{4}{\pi} e^{-(\frac{\pi^2}{4})t/RC} \quad (7)$$

and $$t/RC = 0.5858 \ (t = 0.5858RC) \quad (8)$$

Thus, $$\text{equation (8)/equation (3)} = 1.546 \quad (9)$$

from which it should be apparent that little more than one dummy word line is sufficient. Actually, increasing $V_{TH}$ to 0.6 $V_{DD}$ from $\frac{1}{2} V_{DD}$ can increase the value of equation (3), thus making it possible to shorten the total length of the dummy word lines calculated by dividing equation (8) by equation (3) as presented in the above equation (9).

Although the resistance R of the polysilicon forming the word line and the gate capacitance of the transistor are likely to vary in the process of manufacturing the semiconductor circuit device, the dummy word line can be used without causing problems since the word line on the side of the RAM circuit and the dummy word line have the same resistance and capacitance.

Further it is possible to eliminate, as in FIG. 7, the problem of the voltage dependency or the like in the circuit in FIG. 3 which uses the inverter and the capacitor.

The embodiment shown in FIG. 8, using dummy word lines DWL₁ and DWL₂, will be described with reference to the case where no problems would be raised even when the resistance R of the polysilicon is small, or m is small, i.e., the time constant is small.

Figure 6A:
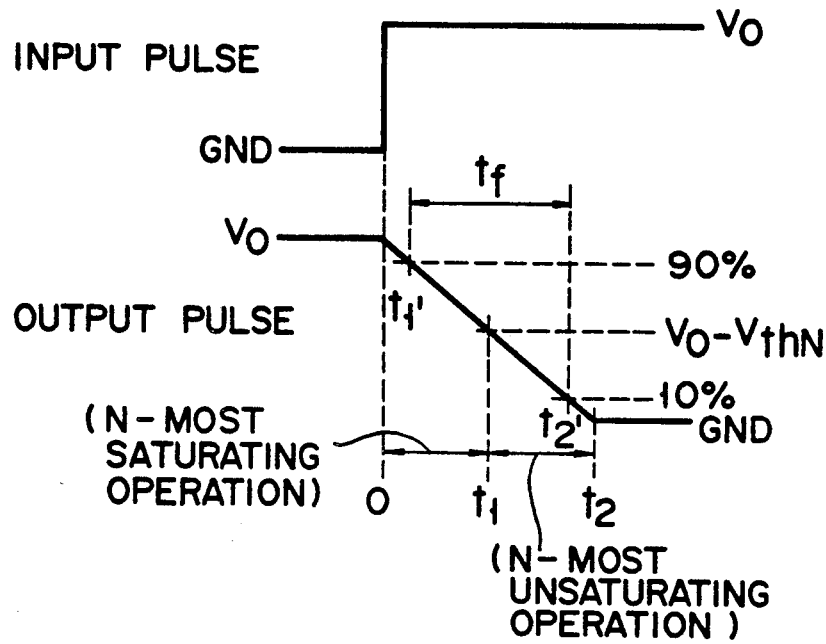
FIG. 6A is a waveform diagram illustrating a charge/discharge model of a CMOS inverter.
Figure 6B:
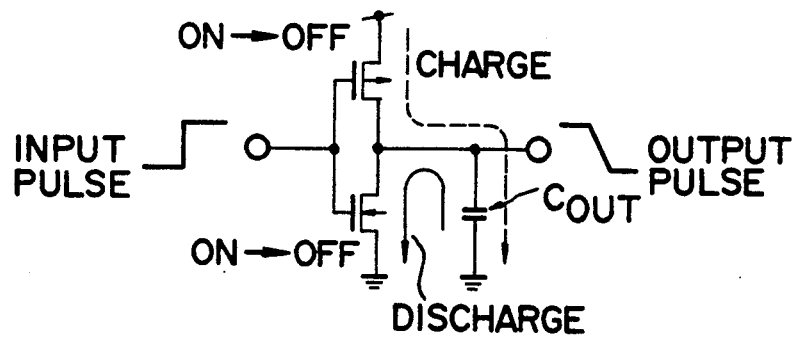
FIG. 6B is a circuit diagram of FIG. 6A.
Figure 10A:
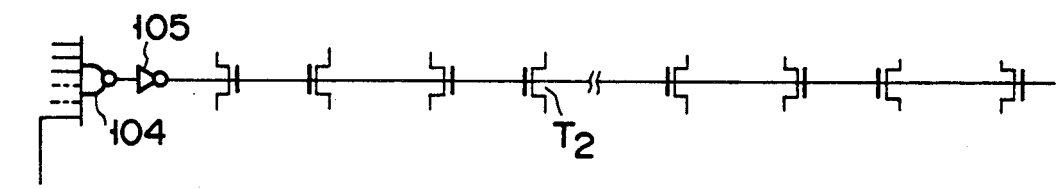
FIG. 10A is a circuit of a word line portion in FIGS. 1 and 2.
Figure 10B:
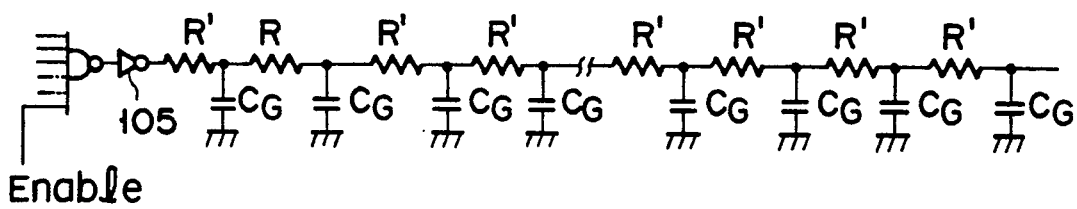
FIG. 10B is an equivalent circuit of FIG. 10B.

Provided that the resistance R on the word line shown in FIG. 10 is very small, and that $t_r$ and $t_f$ of the word line are determined by only the capacitance provided by a transfer gate in the RAM cell 101, the circuit in FIG. 10 is equivalent to the charge/discharge model of the CMOS inverter shown in FIG. 6B (FIG. 6A is an ideal waveform pattern of the input/output of the COMS inverter) (Reference material: Practical Handbook Series "How to use CMOS circuit (I)," written by Yasoji Suzuki, issued by the Industrial Research Association). A transient response ($t_r$ and $t_f$) in FIG. 6B is therefore expressed as follows:

$$t2 = \frac{C_{OUT} \cdot V_{THN}}{K_n(V_O - V_{THN})^2} + \frac{C_{OUT}}{2K_N(V_O - V_{THN})} \ln \frac{2(V_O - V_{THN}) - V_{OUT}}{V_{OUT}} \quad (10)$$

where t2 is the time for the transistor to reach the ground level from the $V_O(V_{DD})$, $V_{THN}$ is the threshold voltage of the transfer gate T2, $V_{OUT}$ is the voltage potential of the word line, $C_{OUT}$ is all the load capacitance that the word lines have, and $K_N$ is a constant that the N-channel type transistor of the inverter has.

When the level of the signal Enable in FIG. 8 changes from "H" to "L" and $V_{TH}$ of the inverter 143 and the NOR circuit 141 is $\frac{1}{2} \cdot V_{DD}$ (=$\frac{1}{2} \cdot V_O$), and when the source voltage $V_{DD}$=5 (V), $V_{TH}$ of the transistor T2=0.9 (V), and the inverter 105 has the same W/L as the inverter 103, substituting $V_O$=5 (V), $B_{THN}$=0.9 (V), and $V_{OUT}$=2.5 (V) in the equation (10) yields the time to reach $\frac{1}{2}V_{DD}$ at which the level of the inverter 143 changes from "H" to "L":

$$t2 = \frac{C_{OUT} \cdot 0.9}{K_N(5-0.9)^2} + \frac{C_{OUT}}{2K_N(5-0.9)} \ln \frac{2(5-0.9)-2.5}{2.5} \quad (11)$$

$$= 0.0535 \frac{C_{OUT}}{K_N} + 0.1005 \frac{C_{OUT}}{K_N}$$

$$= 0.1540 \frac{C_{OUT}}{K_N}$$

The time for the transistor $T_2$ on the side of the RAM circuit to change its state from ON to OFF is the time needed to reach $V_{OUT}$ becomes 0.9 (V), then $$t2 = \frac{C_{OUT} \cdot 0.9}{K_N(5-0.9)^2} + \frac{C_{OUT}}{2K_N(5-0.9)} \ln \frac{2(5-0.9)-0.9}{0.9} \quad (12)$$

$$= 0.0535 \frac{C_{OUT}}{K_N} + 0.2553 \frac{C_{OUT}}{K_N}$$

$$= 0.3088 \frac{C_{OUT}}{K_N}$$

The value indicated by the equation (11) is the time to discharge one word line. With the same transistor performance given, the second word line also requires the same discharging time, so that $$0.1540 \frac{C_{OUT}}{K_N} \times 2 = 0.3080 \frac{C_{OUT}}{K_N} \quad (13)$$

With the two word lines provided, the precharge time can be secured until the transfer gate $T_2$ on the side of the RAM circuit is turned off, and the circuit in FIG. 8 employing the dummy word line also can be used without any problem to prevent the through current. The use of the dummy word line is effective when the process-oriented variation, the voltage dependency, and the time constant are large.

The present invention is not restricted to the above-described embodiments, but may be applied in various manners. For example, according to the present invention, if the circuits in FIGS. 7 and 8 are combined together, and the combined circuit incorporated in the same semiconductor memory circuit apparatus, a highly-reliable RAM circuit can be realized, which is less affected by the process-oriented variation and is less dependent on the source voltage. Further, this RAM circuit may be provided together with a CPU on a single chip, forming a one-chip microcomputer structure. If the dummy word line of the present invention is designed to have a structure different from that of the word line on the RAM cell side, e.g., part of the dummy word line is modified insignificantly, the dummy word line would have the CR time constant equivalent to the one used in the present invention.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A semiconductor memory circuit apparatus, comprising:

a random access memory having memory cells arranged in a matrix connected to a plurality of word lines and bus lines, each of the memory cells including a load element, a first transistor connected to the load element at a first node, and a second transistor having a source and drain path connected between the first node and the corresponding bus line, and a gate connected to the corresponding word line, wherein each bus line has an associated first capacitor;

a sense amplifier for performing a read operation of the random access memory;

a third transistor having the same channel length and channel width as the second transistor and having a gate;

a dummy word line like one of word lines of the random access memory, the dummy word line being connected to the gate of the third transistor;

an inverter having an output terminal and comprising the third transistor and a fourth transistor, having the same channel width and channel length as the first transistor, connected in series between the output terminal and a first voltage supply, and a second load element like the first load element connected between the output terminal and a second voltage supply; wherein the fourth transistor receives an enable signal as a gate input to enable a memory operation; and a second capacitor connected to the output terminal of said inverter at a second node;

wherein the potential at the second node is used as a timing signal for the sense amplifier.

2. A semiconductor memory circuit apparatus, comprising:

a random access memory having a plurality of memory cells arranged in a matrix connected to a plurality of word lines and bus lines, each of said memory cells including a first load element, a first transistor connected to the first load element at a node, and a second transistor having a source and drain path connected between the node and the corresponding bus line, and a gate connected to the corresponding word line, wherein each bus line has an associated first capacitor;

a sense amplifier for performing a read operation of the random access memory;

a signal generating circuit for precharging the bus lines of the random access memory after one of a read operation and a write operation is performed;

a dummy word line longer than one of the word lines of the random access memory like the one word line;

a third transistor having the same channel width and channel length as the second transistor, a gate of the third transistor being connected to the dummy word line;

a detecting circuit for detecting that the dummy word line becomes unselected; and precharging means for precharging said bus lines of said random access memory in accordance with an output of said detecting circuit.

3. An apparatus according to claim 1, further comprising a detecting means for detecting the potential at the second node wherein the second capacitor is used to adjust a time period from a point when the dummy word line starts either charging or discharging to a point when a potential change of said drain is detected, and said sense amplifier is operated by said detecting means.

4. An apparatus according to claims 1 or 3, wherein the second capacitor has a capacitance substantially equal to that of the first capacitor.

5. An apparatus according to claim 4, wherein the first capacitor is a parasitic capacitor of the associated bus line.

6. An apparatus according to claim 1, wherein said first and second load elements are a fifth and sixth transistors of a first channel conductivity-type, said first to fourth transistors are a second channel conductivity-type, the channel width and the channel length of the first and the fourth transistors are equal to each other, and the channel length and channel width of the fifth and the sixth transistors are equal to each other.

7. An apparatus according to claims 1, 2 or 3, wherein each of said memory cells further includes a circuit having the same pattern as the combination of the first and second transistors and the first load element, wherein the first transistors and the first load element of the first circuit constitute a first CMOS inverter, a transistor and a load element of the second circuit constitute a second CMOS inverter, an input portion of the first CMOS inverter is connected to an output portion of the second CMOS inverter, an input portion of the second CMOS inventor is connected to an output portion of the first MOS inventor, and outputs from the first and second CMOS inventors are connected to corresponding bus lines via the second transistors of the first and second circuits.

8. An apparatus according to claim 2, wherein the dummy word line has a capacitance equal to or less than that of the first capacitor.

9. An apparatus according to claim 8, wherein the first capacitor is a parasitic capacitor of the associated bus line.

* * * * *